US007856519B2

(12) United States Patent
Tan et al.

(10) Patent No.: US 7,856,519 B2
(45) Date of Patent: Dec. 21, 2010

(54) SOLID-STATE STORAGE DEVICE WITH WIRELESS HOST INTERFACE

(75) Inventors: Henry Tan, Singapore (SG); Teng Pin Poo, Singapore (SG)

(73) Assignee: Trek 2000 International Ltd., Loyang Industrial Estate (SG)

( * ) Notice: Subject to any disclaimer, the term of this patent is extended or adjusted under 35 U.S.C. 154(b) by 380 days.

(21) Appl. No.: 11/629,691

(22) PCT Filed: Jun. 15, 2005

(86) PCT No.: PCT/SG2005/000192

§ 371 (c)(1),
(2), (4) Date: Sep. 24, 2008

(87) PCT Pub. No.: WO2005/122711

PCT Pub. Date: Dec. 29, 2005

(65) Prior Publication Data

US 2009/0150584 A1    Jun. 11, 2009

(30) Foreign Application Priority Data

Jun. 15, 2004    (SG) .............................. 200403732-1

(51) Int. Cl.
*G06F 13/42* (2006.01)
(52) U.S. Cl. ........................ 710/106; 710/305; 710/306; 710/11; 713/300; 455/3.01
(58) Field of Classification Search ................... 710/11, 710/106, 305–306; 711/115; 713/300–340; 455/66
See application file for complete search history.

(56) References Cited

U.S. PATENT DOCUMENTS

| 5,551,065 A | 8/1996 | Honore |
| 6,509,911 B1 | 1/2003 | Shimotono |
| 6,633,583 B1 * | 10/2003 | Esterson ..................... 370/466 |

(Continued)

FOREIGN PATENT DOCUMENTS

DE    101 28 469 A1    12/2002

(Continued)

*Primary Examiner*—Mark Rinehart
*Assistant Examiner*—Kim T Huynh
(74) *Attorney, Agent, or Firm*—Ladas & Parry, LLP

(57) ABSTRACT

A solid-state memory storage device and method for using the device includes storing data wirelessly transmitted from a host and wirelessly transmitting the data to the host. The storage device has an RF module which demodulates an ultra-wideband write signal received wirelessly from a host and outputs a wireless protocol write signal. A wireless protocol controller has a protocol conversion layer which converts the wireless protocol write signal into a USB protocol write signal. A microcontroller has function extraction layer for extracting a write command from the USB protocol write signal and, in response to the write command, controls the writing of data extracted from the USB protocol write signal to the solid-state memory to store the data in the solid-state memory. The microcontroller also reads the data stored in the solid-state memory in response to a read command received from the host and outputs a USB protocol read signal to the wireless protocol controller. The protocol conversion layer also translates the USB protocol read signal into a wireless protocol read signal. The RF module also modulates the wireless protocol read signal and outputs an ultra-wideband signal for wireless transmission to the host.

26 Claims, 2 Drawing Sheets

U.S. PATENT DOCUMENTS

| | | |
|---|---|---|
| 6,725,302 B1 | 4/2004 | Benayoun et al. |
| 7,118,024 B1 | 10/2006 | Hoshino |
| 7,643,811 B2 * | 1/2010 | Reunamaki et al. ...... 455/226.2 |
| 2003/0014676 A1 * | 1/2003 | Wang et al. .................. 713/323 |
| 2003/0043771 A1 | 3/2003 | Mizutani et al. |
| 2003/0081630 A1 | 5/2003 | Mowery et al. |
| 2003/0086388 A1 | 5/2003 | Peters et al. |
| 2003/0097520 A1 | 5/2003 | Lai et al. |
| 2004/0023683 A1 | 2/2004 | Mizuhiki et al. ......... 455/550.1 |
| 2004/0073727 A1 * | 4/2004 | Moran et al. ................... 710/74 |
| 2004/0203415 A1 * | 10/2004 | Wu .......................... 455/66.1 |
| 2005/0045720 A1 * | 3/2005 | Fruhauf ...................... 235/440 |
| 2005/0076256 A1 * | 4/2005 | Fleck et al. ................. 713/320 |
| 2006/0164271 A1 * | 7/2006 | Hirt et al. ................... 341/143 |
| 2009/0157960 A1 * | 6/2009 | Koga ........................... 711/115 |

FOREIGN PATENT DOCUMENTS

| | | |
|---|---|---|
| EP | 1 191 446 A2 | 3/2002 |
| JP | 2001-156797 | 6/2001 |
| JP | 2001-258153 | 9/2001 |
| JP | 2003-101512 | 4/2003 |
| JP | 2004-164566 | 6/2004 |
| KR | 1020040039114 | 11/2002 |
| KR | 2003-0089554 | 11/2003 |
| KR | 2004-0035141 | 4/2004 |
| KR | 2004-0040982 | 5/2004 |
| TW | 553447 | 9/2003 |
| WO | 98/28693 | 7/1998 |
| WO | 01/31459 A1 | 5/2001 |
| WO | 02/42887 A3 | 5/2002 |
| WO | 03/003141 | 1/2003 |
| WO | 03/003141 A2 | 1/2003 |
| WO | 03/052606 A1 | 6/2003 |
| WO | 2005/122711 A2 | 12/2005 |

* cited by examiner

SOLID-STATE STORAGE DEVICE WITH WIRELESS HOST INTERFACE

BACKGROUND OF THE INVENTION

1. Field of the Invention

The present invention relates generally to data transfer and storage. The present invention more particularly relates to the wireless transfer, storage and recall of data between a solid-state external data storage device and other electronic devices.

2. Description of the Related Art

A Wireless Universal Serial Bus (WUSB) standard is being prepared that will have the functionality of traditional "wired" USB, but without needing the wired connections (see "Wireless USB: The First High-speed Personal Wireless Interconnect", "White Paper", Intel, 2004, which is incorporated by reference in its entirety into the present disclosure). The WUSB standard provides a high-speed host to device connection that enables an easy migration path for prior-art wired USB solutions. The WUSB topology uses a host (for example a PC) which initiates all the data traffic among the devices connected to it, allotting time slots and data bandwidth to each device connected. The connections are point-to-point and directed between the WUSB host and WUSB devices. The host and connected devices is referred to as a cluster. Unlike wired USB, there are no hubs present in the connection topology.

The WUSB standard is implemented with radios using Ultra-Wideband (UWB). The UWB standard is described in "Ultra-Wideband (UWB) Technology: Enabling High-speed Wireless Personal Area Networks", "White Paper", Intel, 2004, which is incorporated by reference in its entirety into the present disclosure. The frequency range for UWB is from 3.1 GHz to 10.6 GHz, a band 7.5 GHz wide. This 7.5 GHz wide spectrum is divided into several 528 MHz bands. The use of UWB allows Wireless USB to provide data speeds of up to 480 Mbps within a 10-meter range.

The Wireless USB White Paper discloses using WUSB to transfer data with a mass storage device (e.g. HDD, DVD-RW, CD-RW, etc.) at page 4. However, it fails to realize the possibility of using WUSB to transfer data with the portable storage devices based on solid-state memory. These types of devices are becoming increasingly important and include such devices as the ThumbDrive® produced by the Assignees of the present application, or a compact flash card, a multimedia card, a memory stick, smart media, etc. The extra portability offered by the WUSB standard makes it very desirable for use with such devices. Also, the Wireless USB White Paper provides no method for how to use the WUSB standard with a solid-state memory storage device.

International Application WO 03/003141, published 9 Jan. 2003 and also assigned to the Assignees of the present invention, discloses the wireless transmission of data between a storage device which is based on solid-state memory and a computer using communication protocols such as IEEE802.11, Bluetooth, irDA, etc., but does not disclose the use of ultra-wideband signals, and in particular the WUSB protocol, which provides higher data transfer rates.

It would be desirable to have a solid-state memory storage device for storing data received wirelessly from a host using an ultra-wideband signal and for wirelessly transmitting the data to the host using an ultra-wideband signal.

SUMMARY OF THE INVENTION

The present invention addresses the above problems by providing a solid-state memory storage device for storing data wirelessly transmitted using ultra-wideband from a host and for wirelessly transmitting the data using ultra-wideband to the host.

More specifically, a solid-state memory storage device and a method of using the device includes storing data wirelessly transmitted from a host and wirelessly transmitting the data to the host. The storage device has an RF module which demodulates an ultra-wideband write signal received wirelessly from a host and outputs a wireless protocol write signal. A wireless protocol controller has a protocol conversion layer which converts the wireless protocol write signal into a USB protocol write signal. A microcontroller has function extraction layer for extracting a write command from the USB protocol write signal and, in response to the write command, controls the writing of data extracted from the USB protocol write signal to the solid-state memory to store the data in the solid-state memory. The microcontroller also reads the data stored in the solid-state memory in response to a read command received from the host and outputs a USB protocol read signal to the wireless protocol controller. The protocol conversion layer also translates the USB protocol read signal into a wireless protocol read signal. The RF module also modulates the wireless protocol read signal and outputs an ultra-wideband signal for wireless transmission to the host.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENTS

Figure 1:
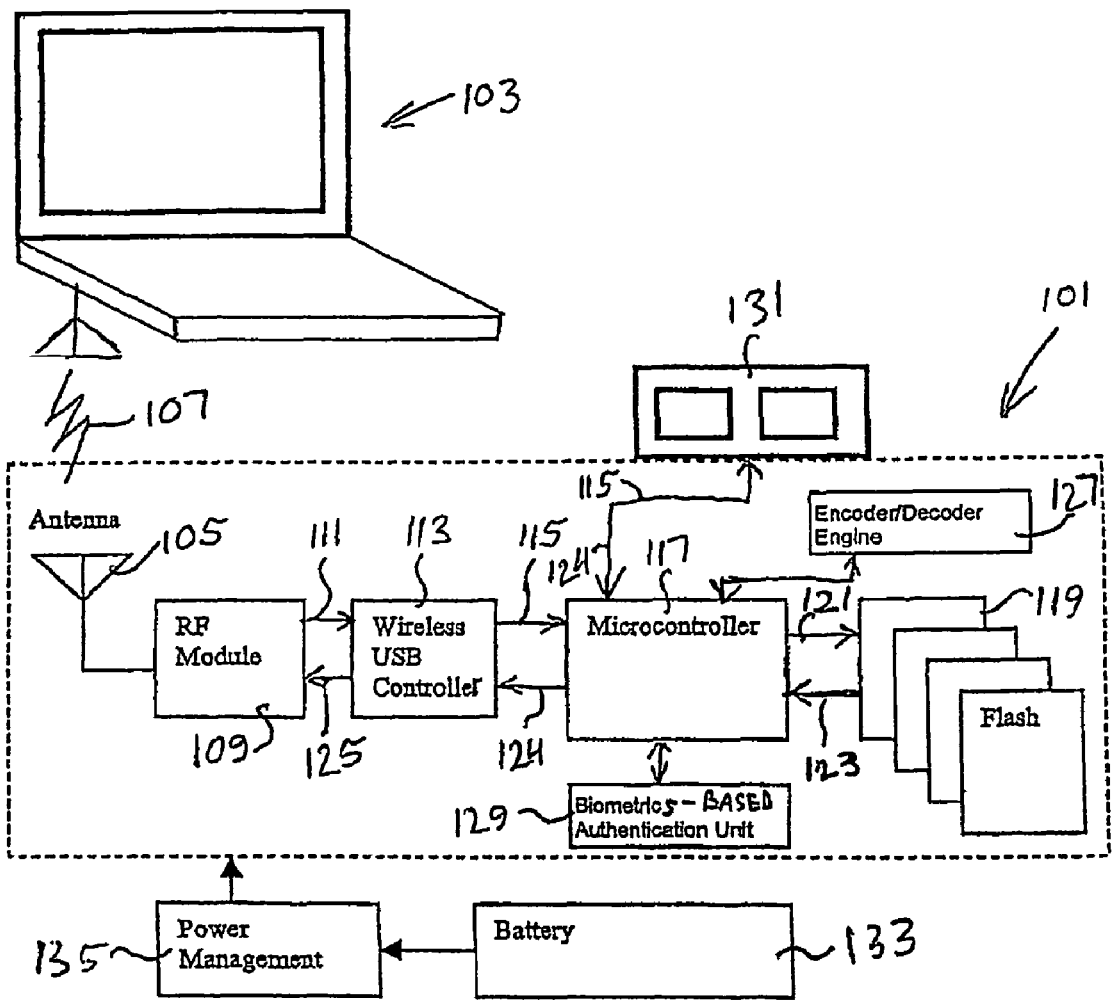
FIG. 1 shows a diagrammatic view of a solid-state memory storage device.

The invention is described with reference to FIG. 1, which shows a diagrammatic view of a solid-state memory storage device 101 of the present invention. The invention is further described with reference to FIG. 2, which is a diagram of the protocol layers providing the functions of the invention. The solid-state memory storage device 101 is preferably of a size that can easily fit in the palm of a user's hand and easily fit within the user's pocket for convenient portability.

A host 103 can transmit write data for storage by the storage device 101. The host 103 can be any processing device that can be benefited by using external data storage, such as a personal computer, camera, video camera, organizer, MP3 player or a PDA. The host 103 includes a WUSB controller, RF module and antenna for producing and sending a modulated WUSB protocol UWB RF signal 107 containing the write data (write data WUSB signal).

The connection is point-to-point between the host 103 and the storage device 101. In addition to the storage device 101, other storage devices or other types of devices can be simultaneously connected to the same host 103 forming a cluster.

The host 103 initiates all the data traffic among the devices connected to it, allotting time slots and data bandwidth to each device connected.

An antenna 105, integral with the storage device 101, wirelessly receives the write data to be stored by the storage device 101. From the antenna 105, the signal 107 passes to an RF module 109 having a physical protocol layer 201 which demodulates the write data WUSB RF signal 107 to produce a demodulated WUSB protocol write signal 111. In alternative embodiments the antenna 105 is separate from the storage device 101 and plugs into the storage device 101.

The RF module 109 also has a media access control layer (MAC) 203. The MAC 203 controls the flow of WUSB data packets between the host 103 and the storage device 101. The MAC 203 also insures that packets sent from different hosts across the same channel don't collide.

The WUSB protocol write signal 111 passes to a WUSB controller 113 having a USB conversion layer 205 which extracts a write data USB protocol signal 115 from the WUSB protocol write signal 111. The write data USB protocol signal 115 is then sent to a microcontroller 117.

Both the WUSB controller of the host 103 and the WUSB controller 113 of the storage device 101 serve to convert between WUSB signals and standard USB signals.

The WUSB standard is still undergoing revisions, however, for the purposes of the present invention, WUSB can be described as an ultra-wideband wireless system. In particular, the frequency spectrum should be at least 7 GHz wide. For example, in the currently defined UWB specification, the frequency range should be from 3.1 GHz to 10.6 GHz. The wireless ultra-wideband connections are point-to-point and directed between the Wireless USB host and the Wireless USB devices. In one embodiment of the present invention, the Wireless USB host can logically connect to a maximum of 127 Wireless USB devices.

In the present invention, rather than WUSB signals, ultra-wideband (bandwidth $\geq$7 GHz) signals having other protocols can be used. In such alternative embodiments, the WUSB controller 113 can more generally be referred to as a wireless protocol controller for extracting one of the other protocols from a wireless protocol and for translating one of the other protocols back into the wireless protocol.

The microcontroller 117 has a function extraction layer 207 which extracts a specific function from the USB protocol signal 115 (e.g. a function such as write the data in the signal 115 to solid-state memory 119, read data from the solid-state memory 119, or get storage function). When the function is a write data command, the microcontroller 117 causes the write data 121 of the USB protocol signal 115 following the write data command to be written to the solid-state memory.

The microcontroller 117 performs memory management, decoding logical memory from the host 103 to physical memory of the solid-state memory 119. The solid-state memory 119 is preferably non-volatile memory and can be flash memory having NAND or NOR architecture, EPROM, EEPROM, MRAM or FRAM, for example.

The solid-state memory 119 has a size of at least 8 MB (mega bytes) and preferably more than 1 GB (giga byte) of non-volatile memory. To increase the amount of data that can be stored by the storage device 101, in one embodiment, the data is stored in the solid-state memory 119 in compressed format. The microcontroller 117 routes the write data USB protocol signal 115 to an encoder/decoder engine 127 built-into the storage device 101 which then encodes the signal 115 into compressed data. The microcontroller 117 then sends the compressed data to the solid-state memory 119 as the write data 121 for storage.

In an alternative embodiment, the encoder/decoder engine 127 is located between the WUSB controller 113 and the microcontroller 117, thereby encoding signal 115 into compressed data before reaching the microcontroller.

The data can be compressed using any appropriate known algorithm. The encoder/decoder engine 127 can additionally have an input for switching between different compression algorithms to produce different compression formats. In such an embodiment, the solid-state memory 119 can be partitioned to separately store data having different compression formats.

The large storage capacity and data compression allows the storage device 101 to store large multimedia files, programs, operating systems, etc.

The data can be stored indefinitely in the storage device 101 before being read back to a computer. Moreover, when the solid-state memory 119 is non-volatile, the memory can be stored indefinitely even when no power is supplied to the storage device 101.

When the host 103 needs to read data 123 stored in the solid-state memory 119, it sends a data read request to the microcontroller 117 in a similar fashion to sending the write data WUSB signal 107. When the extraction layer 207 of the microcontroller 117 receives the data read request, it reads data 123 stored in the solid-state memory 119 and converts it to a read data USB protocol signal 124 which passes to the WUSB controller 113.

In embodiments in which the data is stored in a compressed format, the microcontroller 117 sends the compressed read data USB protocol signal 123 to the encoder/decoder engine 127 for decompression into the read data USB protocol signal 124. Alternatively, when the encoder/decoder engine 127 is located between the WUSB controller 113 and the microcontroller 117, the read data USB protocol signal 124 is decompressed after leaving the microcontroller 117.

The USB conversion layer 205 of the WUSB controller 113 translates the read data USB protocol signal 124 into a read data WUSB protocol signal 125 which is sent to the RF Module 109. Again, the MAC 203 of the RF Module 109 controls the flow of WUSB data packets between the host 103 and the storage device 101. The physical protocol layer 201 of the RF module 109 modulates the read data WUSB signal 125 and feeds the signal 125 to the antenna 105 for wireless transmission of the signal 107 to the host 103.

Figure 2:
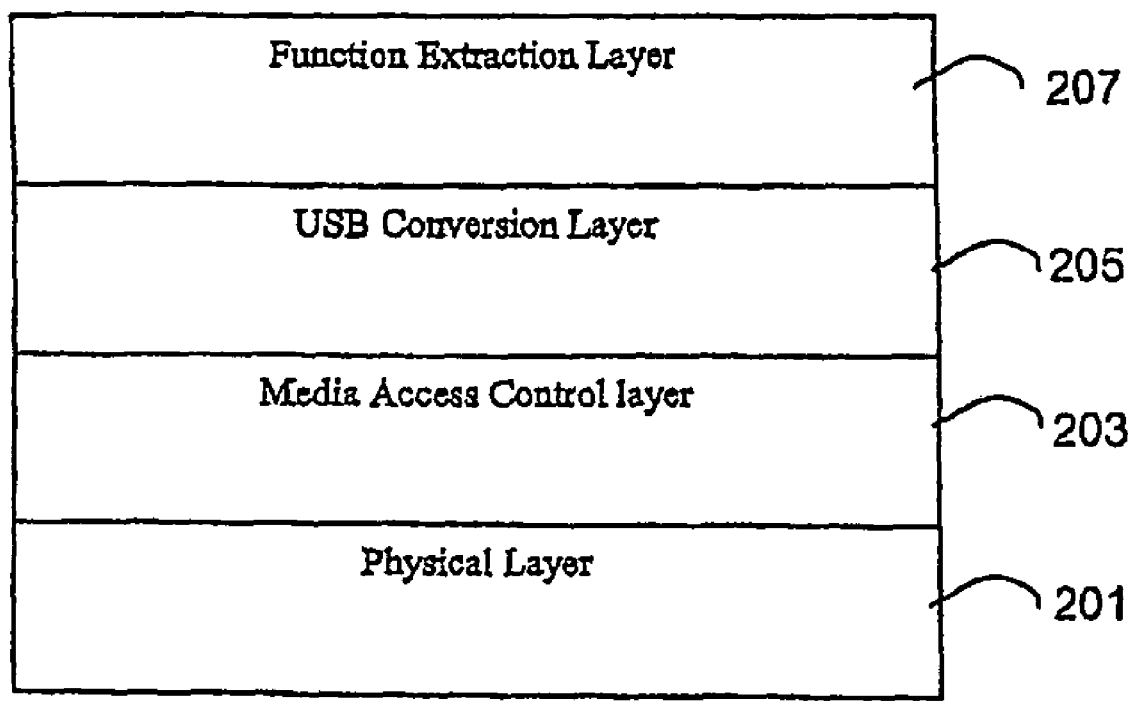
FIG. 2 is a diagram of the protocol layers providing the functions of the device of FIG. 1.

The storage device 101 can also include a biometrics-based authentication unit 129 integral with the storage device 101, as shown in FIG. 1. The biometrics-based authentication module 129 is coupled to and controlled by the microcontroller 117. Access to the solid-state memory 119 for reading or writing data is granted to the host 103 provided that the biometrics-based authentication module 129 authenticates the identity of a user of the host 103. Access to the solid-state memory 119 is denied to the host 103 otherwise. The authentication module 129 can be used to protect confidential data stored on the storage device 101. It can also be used to prevent a user from writing copyrighted material to the storage device 101 without paying for it. In one embodiment, the biometrics-based authentication module 129 includes a thumbprint sensor for acquiring data from a thumbprint of the user. Alternatively, other biometric data can be used. Biometric data can be stored in the biometric authentication unit 129 for comparison with the acquired data.

A power supply 133 and power management system 135 are shown in FIG. 1. Preferably the power supply 133 is portable and can be an alkaline battery, a rechargeable battery or a button cell or a fuel cell, for example.

In a preferred embodiment, the storage device 101 is portable, and in order to maximize its portability, power conservation is a consideration. The power management system 135 monitors communications between the host and the solid-state memory storage device 119. The power management system 135 provides minimum power from the portable power supply 133 when detecting no communications between the host 103 and the solid-state memory storage device 101 and provides maximum power from the portable power supply 133 when detecting communications between the host 103 and the solid-state memory storage device 119. When the power supply 133 is rechargeable, the power management system also manages recharging of the power supply. Preferably both the power management system 135 and power supply 133 are integral with the storage device 101 for improved portability.

In one embodiment, the solid-state memory storage device 101 also includes an integral built-in USB male-type connector 131 which can provide a wired connection for transferring the write data USB protocol signal 115 from the host 103 to the microcontroller 117 and for transferring the read data USB protocol signal 124 to the host 103. This is useful if it is necessary to use the storage device 101 with another electronic device which is equipped with a USB female-type connector but not with WUSB.

In the above disclosure, rather than using the WUSB standard, other wireless standards can be used so long as they are ultra-wideband and particularly if they use the UWB standard encompassing the frequency range from 3.1 GHz to 10.6 GHz. In the present invention, an ultra-wideband signal is generally defined as a signal having an ultra-wideband spectrum band at least 7.0 GHz wide.

The invention claimed is:

1. A solid-state memory storage device for storing data transmitted from a host and for transmitting the data to the host, the solid-state memory storage device comprising:
    a non-volatile solid-state memory for storing the data;
    an RF module operable to demodulate an ultra-wideband write signal received wirelessly from the host and outputs a wireless protocol write signal;
    a wireless protocol controller having a protocol conversion layer operable to convert the wireless protocol write signal into a first USB protocol write signal;
    an integral built-in USB male-type connector operable to receive a second USB protocol write signal non-wirelessly from the host;
    a portable power supply and a power management system, the power management system being operable to monitor communications between the host and the solid-state memory storage device, so that the power management system provides minimum power from the portable power supply when detecting no communications between the host and the solid-state memory storage device and provides maximum power from the portable power supply when detecting communications between the host and the solid-state memory storage device; and
    a microcontroller having a function extraction layer for extracting a write command from the first or second USB protocol write signal and, in response to the write command, controlling the writing of data extracted from the first or second USB protocol write signal to the non-volatile solid-state memory to store the data in the non-volatile solid-state memory,
    the micro controller being operable to read the data stored in the non-volatile solid-state memory in response to a read command received from the host and outputs either a first USB protocol read signal to the wireless protocol controller or a second USB protocol read signal to the integral built-in USB male-type connector;
    and if the wireless protocol controller receives the first USB protocol read signal, the protocol conversion layer is further operable to translate the first USB protocol read signal into a wireless protocol read signal; and
    the RF module is further operable to modulate the wireless protocol read signal and to output an ultra-wideband read signal for wireless transmission to the host.

2. A solid-state memory storage device according to claim 1, wherein the ultra-wideband signal has a frequency spectrum at least 7 GHz wide.

3. A solid-state memory storage device according to claim 1, wherein the wireless protocol write signal is a WUSB protocol write signal, the wireless protocol controller is a WUSB controller having a USB conversion layer which is operable to extract the first USB protocol write signal from the WUSB protocol write signal, and the wireless protocol read signal is a WUSB protocol read signal.

4. A solid-state memory storage device according to claim 1, further comprising an antenna, integral with the solid-state memory storage device, the antenna being operable to wirelessly receive the ultra-wideband write signals from the host and to wirelessly transmit the ultra-wideband read signal to the host.

5. A solid-state memory storage device according to claim 1, wherein the micro controller is operable to perform memory management.

6. A solid-state memory storage device according to claim 5, wherein the microcontroller is operable to decode logical memory from the host to physical memory of the non-volatile solid-state memory.

7. A solid-state memory storage device according to claim 1, wherein the non-volatile solid-state memory has an NAND architecture.

8. A solid-state memory storage device according to claim 1, wherein the non-volatile solid-state memory has at least 8 MB memory capacity for storing data in compressed format and the solid-state memory storage device further comprises a built-in encoder/decoder engine for compressing and decompressing the data.

9. A solid-state memory storage device according to claim 1, further comprising a biometrics-based authentication module coupled to and controlled by the microcontroller, wherein access to the non-volatile solid-state memory is granted to the host provided that the biometrics-based authentication module authenticates the identity of a user of the host and wherein access to the non-volatile solid-state memory is denied to the host otherwise.

10. A solid-state memory storage device according to claim 9, wherein the biometrics-based authentication module includes a thumbprint sensor for acquiring data from the thumbprint of the user.

11. A solid-state memory storage device according to claim 1, wherein the host is a personal computer.

12. A solid-state memory storage device according to claim 1, wherein the power management system also manages recharging of the portable power supply.

13. A solid-state memory storage according to claim 1, wherein the portable power supply is selected from the group consisting of: an alkaline battery, a rechargeable battery, a button cell and a fuel cell.

14. A method of using a solid-state memory storage device having a non-volatile solid-state memory, the solid-state memory storage device being for storing data transmitted from a host and for transmitting the data to the host and the solid-state memory storage device being operable to transmit data to and from the host wirelessly or non-wirelessly, wherein if data is transmitted wirelessly between the solid-state memory storage device and the host, the method comprises either the steps of:
- a) receiving an ultra-wideband write signal wirelessly from a host;
- b) demodulating the ultra-wideband write signal by a physical protocol layer of an RF module and outputting a wireless protocol write signal;
- c) converting the wireless protocol write signal into a first USB protocol write signal by a protocol conversion layer of a wireless protocol controller; and
- d) extracting a write command from the first USB protocol write signal by a function extraction layer of a microcontroller and, in response to the write command, controlling the writing of data extracted from the first USB protocol write signal to the non-volatile solid-state memory by the microcontroller to store the data in the non-volatile solid-state memory; or
- a) reading the data stored in the non-volatile solid-state memory by the microcontroller in response to a read command received from the host and outputting from the microcontroller a first USB protocol read signal to the wireless protocol controller;
- b) translating the first USB protocol read signal into a wireless protocol read signal by the protocol conversion layer of the wireless protocol controller; and
- c) modulating the wireless protocol read signal by the RF module and outputting an ultra-wideband read signal for wireless transmission to the host;

and wherein if data is transmitted non-wirelessly between the solid-state memory storage device and the host, the method comprises either the step of:
- a) receiving a second USB protocol write signal from the host through an integral built-in USB male-type connector, the microcontroller extracting a write command from the second USB protocol write signal and, in response to the write command, controls the writing of data extracted from the second USB protocol write signal to the non-volatile solid state memory to store the data in the non-volatile solid-state memory; or
- a) transferring a second USB protocol read signal to the host via the integral built-in USB male-type connector;

and wherein the solid-state memory storage device further comprises a portable power supply and a power management system, such that the method further comprising the steps of the power management system:
- i) monitoring communications between the host and the solid-state memory storage device;
- ii) providing minimum power from the portable power supply when detecting no communications between the host and the solid-state memory storage device; and
- iii) providing maximum power from the portable power supply when detecting communications between the host and the solid-state memory storage device.

15. A method according to claim 14, wherein the ultra-wideband signal has a frequency spectrum at least 7 GHz wide.

16. A method according to claim 14, wherein the wireless protocol write signal is a WUSB protocol write signal, the wireless protocol controller is a WUSB controller having a USB conversion layer which extracts the first USB protocol write signal from the WUSB protocol write signal, and the wireless protocol read signal is a WUSB protocol read signal.

17. A method according to claim 14, wherein the steps of receiving the ultra-wideband write signal wirelessly from the host and outputting the ultra-wideband read signal wirelessly to the host both use an antenna which is integral with the solid-state memory storage device.

18. A method according to claim 14, further comprising a memory management step performed by the microcontroller.

19. A method according to claim 14, wherein as part of the memory management step the microcontroller decodes logical memory from the host to physical memory of the non-volatile solid-state memory.

20. A method according to claim 14, wherein the non-volatile solid-state memory has an NAND architecture.

21. A method according to claim 14, wherein the non-volatile solid-state memory has at least 8 MB memory capacity the method further comprising the step of storing data in compressed format reading the data in compressed format using a built-in encoder/decoder engine for compressing and decompressing the data.

22. A method according to claim 14, wherein the solid-state memory storage device further comprises a biometrics-based authentication module coupled to and controlled by the microcontroller, the method further comprising the steps of:
- a) granting the host access to the non-volatile solid-state memory when the biometrics-based authentication module authenticates the identity of a user of the host; and
- b) denying the access to the non-volatile solid-state memory when the biometrics-based authentication module cannot authenticate the identity of a user of the host.

23. A method according to claim 22, wherein the biometrics-based authentication module includes a thumbprint sensor for acquiring data from the thumbprint of the user.

24. A method according to claim 14, wherein the host is a personal computer.

25. A method according to claim 14, wherein the power management system also manages recharging of the portable power supply.

26. A method according to claim 25, wherein the portable power supply is selected from the group consisting of: an alkaline battery, a rechargeable battery, a button cell and a fuel cell.

* * * * *